United States Patent
Kolar et al.

(10) Patent No.: US 11,587,610 B2
(45) Date of Patent: Feb. 21, 2023

(54) MEMORY HAVING FLYING BITLINES FOR IMPROVED BURST MODE READ OPERATIONS

(71) Applicant: Microsoft Technology Licensing, LLC, Redmond, WA (US)

(72) Inventors: Pramod Kolar, Cary, NC (US); Stephen Edward Liles, Apex, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1 day.

(21) Appl. No.: 17/333,638

(22) Filed: May 28, 2021

(65) Prior Publication Data

US 2022/0383939 A1    Dec. 1, 2022

(51) Int. Cl.
*G11C 7/10* (2006.01)
*G11C 11/4096* (2006.01)
*G11C 11/408* (2006.01)
*G11C 5/06* (2006.01)
(Continued)

(52) U.S. Cl.
CPC ............ *G11C 11/4096* (2013.01); *G11C 5/06* (2013.01); *G11C 11/4085* (2013.01); *G11C 11/4087* (2013.01); *G11C 11/4091* (2013.01); *G11C 11/4094* (2013.01)

(58) Field of Classification Search
CPC ..... G11C 11/419; G11C 11/4096; G11C 5/06; G11C 11/4085; G11C 11/4087; G11C 11/4091; G11C 11/4094
See application file for complete search history.

(56) References Cited

U.S. PATENT DOCUMENTS 6,335,889 B1 * 1/2002 Onodera ............. G11C 11/4097
365/221
2002/0122345 A1   9/2002 Feurle
(Continued)

FOREIGN PATENT DOCUMENTS

EP          0905701 A2    3/1999

OTHER PUBLICATIONS

Augustine, et al., "2X-Bandwidth Burst 6T-SRAM for Memory Bandwidth Limited Workloads", In Proceedings of IEEE Symposium on VLSI Circuits, Jun. 16, 2020, 2 Pages.
(Continued)

*Primary Examiner* — Mushfique Siddique
(74) *Attorney, Agent, or Firm* — Ranjeev Singh; Singh Law, PLLC

(57) ABSTRACT

Memory systems having flying bitlines for improved burst mode read operations and related methods are provided. A memory system comprises a memory array including a first set of memory cells coupled to a first inner wordline and a second set of memory cells coupled to a first outer wordline. The memory system includes a control unit configured to generate control signals for simultaneously: asserting a first wordline signal on the first inner wordline coupled to each of a plurality of inner bitlines, and asserting a second wordline signal on the first outer wordline coupled to each of a plurality of outer bitlines, where each of the plurality of outer bitlines includes a first portion configured to fly over or fly under a corresponding inner bitline, and outputting data from each of the first set of memory cells and the second set of memory cells as part of a burst.

20 Claims, 6 Drawing Sheets

(51) Int. Cl.
    *G11C 11/4094*     (2006.01)
    *G11C 11/4091*     (2006.01)

(56) References Cited

U.S. PATENT DOCUMENTS

| | | | |
|---|---|---|---|
| 2005/0276147 A1* | 12/2005 | Shimbayashi | G11C 7/18 |
| | | | 365/230.05 |
| 2007/0127306 A1* | 6/2007 | Sung | G11C 7/18 |
| | | | 365/230.06 |
| 2008/0123451 A1* | 5/2008 | Rao | G11C 7/12 |
| | | | 365/230.06 |
| 2017/0186483 A1* | 6/2017 | Singh | G11C 11/419 |
| 2020/0258890 A1* | 8/2020 | Augustine | H01L 27/11 |
| 2021/0043251 A1 | 2/2021 | Khellah et al. | |

OTHER PUBLICATIONS

Chang, et al., "A 7nm 256Mb SRAM in High-K Metal-Gate FinFET Technology with Write-Assist Circuitry for Low-VMIN Applications", In Proceedings of International Solid-State Circuits Conference (ISSCC), Feb. 5, 2017, pp. 206-207.

"International Search Report and Written Opinion Issued in PCT Application No. PCT/US22/027553", dated Aug. 1, 2022, 13 Pages.

* cited by examiner

MEMORY HAVING FLYING BITLINES FOR IMPROVED BURST MODE READ OPERATIONS

BACKGROUND

Processors typically include at least one or more processing cores coupled to a random access memory (e.g., a static random access memory (SRAM)) integrated as a single die on an integrated circuit or as multiple die as part of a stack of integrated circuits. Processors for use in machine learning or other artificial intelligence applications require fast access to large chunks of data. As an example, a processor may need access to large amounts of training data and weights that need to be processed to perform machine learning. Other applications of processors may require high bandwidth access to large chunks of data, as well.

To keep up with the demands of processors in applications requiring fast access to large chunks of data, there is a continued need for improvements to memory systems.

SUMMARY

In one example, the present disclosure relates to a method for operating a memory system comprising a first memory sub-array and a second memory sub-array, where the first memory sub-array includes a first set of memory cells coupled to a first inner wordline and a second set of memory cells coupled to a first outer wordline, and where the second memory sub-array includes a third set of memory cells coupled to a second inner wordline and a fourth set of memory cells coupled to a second outer wordline. The method may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. The method may further include outputting data from each of the first set of memory cells, the second set of memory cells, the third set of memory cells, and the fourth set of memory cells as part of a burst.

In another example, the present disclosure relates to a memory system comprising a memory array including a first set of memory cells coupled to a first inner wordline and a second set of memory cells coupled to a first outer wordline. The memory system may further include a control unit configured to generate control signals for: in response to a burst mode read request, simultaneously: (1) asserting a first wordline signal on the first inner wordline coupled to each of a plurality of inner bitlines, and (2) asserting a second wordline signal on the first outer wordline coupled to each of a plurality of outer bitlines, where each of the plurality of outer bitlines includes a first portion configured to fly over or fly under a corresponding inner bitline, and outputting data from each of the first set of memory cells and the second set of memory cells as part of a burst.

In yet another example, the present disclosure relates to a memory system comprising a first memory sub-array and a second memory sub-array, where the first memory sub-array includes a first set of memory cells coupled to a first inner wordline and a second set of memory cells coupled to a first outer wordline, where the second memory sub-array includes a third set of memory cells coupled to a second inner wordline and a fourth set of memory cells coupled to a second outer wordline, where each of the first set of memory cells and the second set of memory cells is organized in a first plurality of columns, and where each of the third set of memory cells and the fourth set of memory cells is organized in a second plurality of columns. The memory system may further include a control unit configured to generate control signals for: in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, where each of the second plurality of outer bitlines includes a second portion configured to fly over or fly under a corresponding inner bitline, and using the shared column circuitry, and outputting data from each of the first set of memory cells, the second set of memory cells, the third set of memory cells, and the fourth set of memory cells as part of a burst. Alternatively, in a second burst mode, the control unit may be configured to generate control signals for: in response to a second mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, where each of the first plurality of outer bitlines includes a first portion configured to fly over or fly under a corresponding inner bitline, and outputting data from each of the first set of memory cells and the second set of memory cells.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to a memory having flying bitlines for improved memory read operations, and in particular, burst mode read operations. Traditionally, reading of data from a memory even as part of a burst operation is not energy efficient and may not have high enough bandwidth to meet the demand for data from faster processing cores. This results in an energy inefficient memory coupled with a processor that has to wait longer to receive data from the memory in response to a read request. Certain examples in this disclosure relate to memory systems that both improve the energy efficiency of the burst mode read operations and support a higher bandwidth to satisfy the demand for data from the faster processing cores or other processing logic (e.g., FPGA logic).

Figure 1:
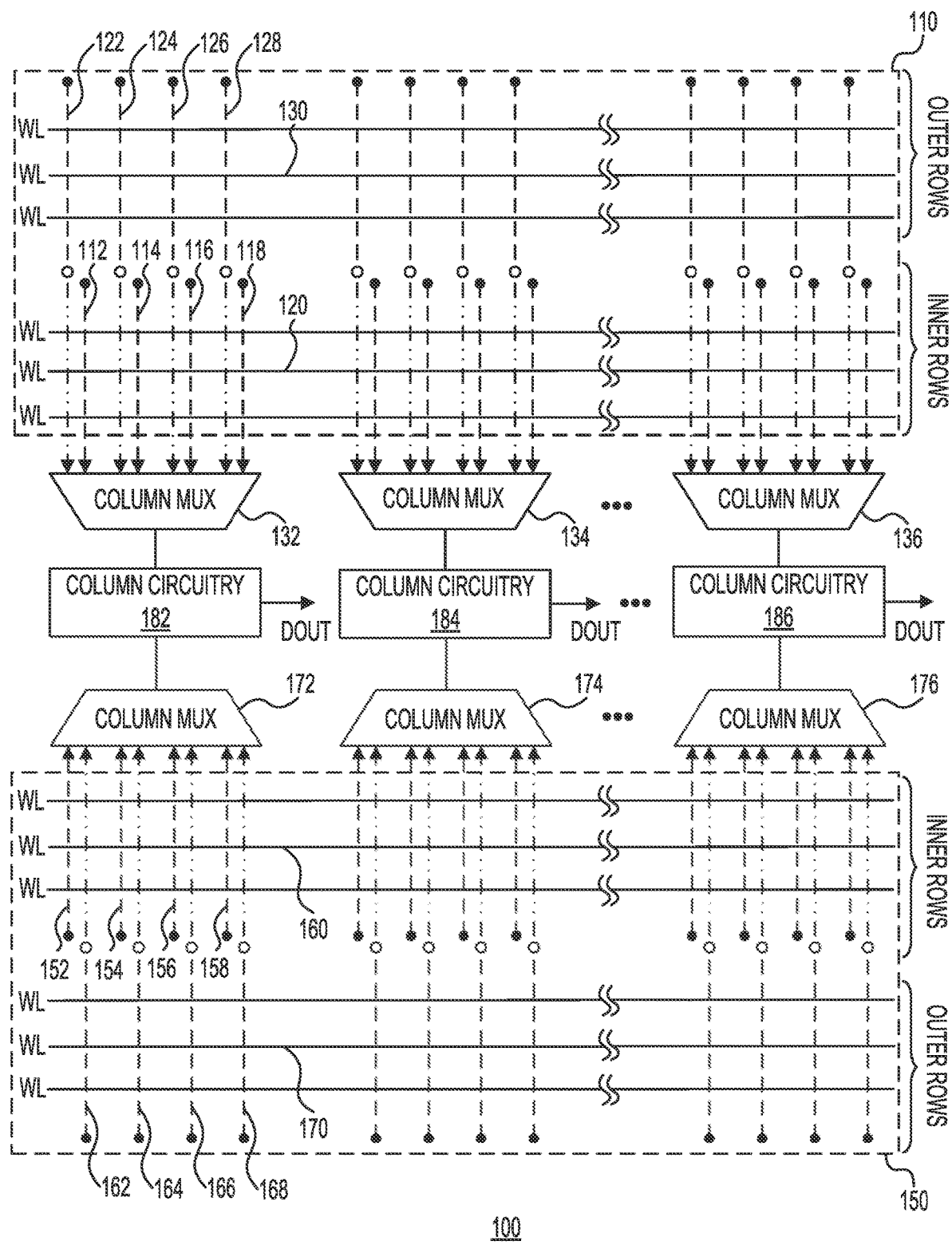
FIG. 1 shows a schematic diagram of a memory having flying bitlines for use in burst mode read operations in accordance with one example.

FIG. 1 shows a schematic diagram of a memory 100 having flying bitlines for use in burst mode read operations in accordance with one example. Memory 100 may include memory sub-array 110 and memory sub-array 150. Memory sub-array 110 may include a set of wordlines (WLs) corresponding to the inner rows (e.g., wordline 120) and another set of wordlines (WLs) corresponding to the outer rows (e.g., wordline 130). Memory sub-array 110 may further include a set of inner bitlines 112, 114, 116, and 118 and a set of outer bitlines 122, 124, 126, and 128. Similarly, memory sub-array 150 may include a set of inner wordlines (WLs) (e.g., wordline 160) and another set of outer wordlines (WLs) (e.g., wordline 170). Memory sub-array 150 may further include a set of inner bitlines 152, 154, 156, and 158 and a set of outer bitlines 162, 164, 166, and 168. In one example, during a burst read operation each of wordlines 120 and 130 of memory sub-array 110 and each of wordlines 160 and 170 of memory sub-array 150 may be simultaneously asserted to allow for access to memory cells connected to both inner and outer bitlines of each of the memory sub-arrays.

With continued reference to FIG. 1, each of inner bitlines 112, 114, 116, and 118, and outer bitlines 122, 124, 126, and 128 may be coupled to a shared column multiplexer (mux) 132. Each of the outer bitlines may be implemented as part of an integrated circuit in a manner that they "fly over" or "fly under" the inner bitlines. In this way, each of inner bitlines 112, 114, 116, and 118, and outer bitlines 122, 124, 126, and 128 may be coupled to a shared column multiplexer (mux) 132. Memory sub-array 110 may include additional sets of inner bitlines and outer bitlines that may be coupled to respective shared column multiplexers (e.g., column mux 134 and column mux 136). Each of inner bitlines 152, 154, 156, and 158, and outer bitlines 162, 164, 166, and 168 may be coupled to a column multiplexer (mux) 172. Memory sub-array 150 may include additional sets of inner bitlines and outer bitlines that may be coupled to respective shared column multiplexers (e.g., column mux 174 and column mux 176). Both column mux 132 and column mux 172 may be coupled to shared column circuitry 182. Similarly, both column mux 134 and column mux 174 may be coupled to shared column circuitry 184. Moreover, both column mux 136 and column mux 176 may be coupled to shared column circuitry 186. As used herein the term "outer wordlines" includes those memory rows that are spatially further away from the column circuitry (e.g., column circuitry 182, 184, or 186) and the term "inner wordlines" includes those memory rows that are spatially closer to the column circuitry. As used herein the term "outer bitlines" includes those bitlines that have memory cells that are accessed when the "outer wordlines" are fired and the term "inner bitlines" includes those bitlines that have memory cells that are accessed when the "inner wordlines" are fired.

Still referring to FIG. 1, wordline signals may be asserted using row decoders (not shown in FIG. 1), including wordline drivers. Row decoders may decode address signals and assert appropriate wordlines using corresponding wordline drivers. Bitline signals may be asserted using column circuitry (e.g., one of column circuitry 182, 184, and 186). Sense amplifiers or other similar circuitry may be used to precharge bitlines prior to the sensing of the voltages on the bitlines. Additional details of the operation of memory 100 are described with respect to memory system 400 of FIG. 4 and waveforms 500 shown in FIG. 5.

With continued reference to FIG. 1, in terms of the burst mode read operation, in one example, two wordlines in each of the memory sub-arrays may be fired together and the read column select signals address may be sequentially incremented. Thus, in one example, wordlines 120 and 130 in memory sub-array 110 and wordlines 160 and 170 in memory sub-array 150 may be fired together. These wordlines once fired may be held in this state until both inner bitlines and outer bitlines corresponding to each column of memory sub-arrays 110 and 150 have output data bits. Advantageously, using this arrangement more data bits may be output per burst read operation while consuming less energy per burst mode read cycle. As an example, as part of the burst mode read operation twice the number of bits may be output with an improved access time. The overall bandwidth (measured in bits/ps) of memory 100 may be approximately 22 percent higher than the bandwidth of conventional memory. As an example, the address decoding time may be saved by decoding an address at the same time for a larger number of data words. At the same time, the energy per bit consumed as part of the burst mode read operation may be approximately 25 percent lower than the energy per bit consumed by a conventional memory. Moreover, the effective bitline loading may be reduced because without the separation of the inner bitlines from the outer bitlines, double the number of memory cells (e.g., 256 cells vs. 128 cells) may be associated with each bitline. The lowered effective bitline loading may further reduce the signal development time on each bitline to approximately 0.6 times the traditional signal development time. Although FIG. 1 shows memory 100 as including a certain number of components arranged in a certain manner, memory 100 may include additional or fewer components, arranged differently.

Figure 2:
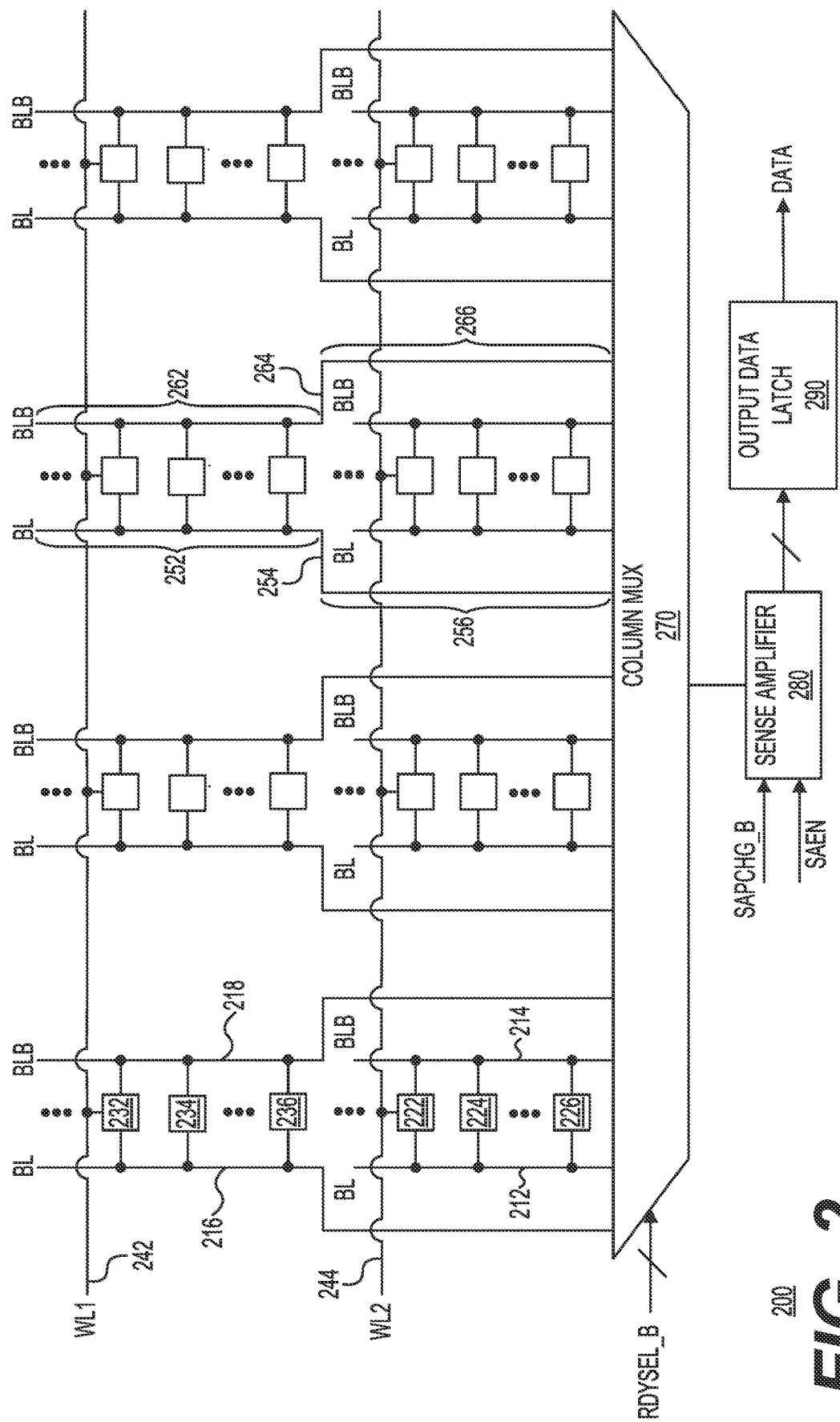
FIG. 2 shows a diagram of a portion of the memory of FIG. 1 in accordance with one example.

FIG. 2 shows a diagram of a portion 200 a memory having flying bitlines for use in burst mode read operations in accordance with one example. Portion 200 shows additional details of a portion of memory sub-array 110 of FIG. 1. As explained earlier with respect to FIG. 1, each memory sub-array that shares column circuitry may include both inner bitlines and outer bitlines. As an example, FIG. 2 shows inner bitlines 212 and 214 and outer bitlines 216 and 218. Memory cells (e.g., static random access memory (SRAM) cells) may be coupled to the bitlines. As an example, in FIG. 2, memory cells 222, 224, and 226 are shown as coupled to inner bitlines 212 and 214 and memory cells 232, 234, and 236 are shown as coupled to outer bitlines 216 and 218. Each row of the memory cells may be driven by a corresponding wordline. FIG. 2 shows wordline (WL1) 242 coupled to the memory cells, including memory cell 232, in an outer row and wordline (WL2) 244 coupled to the memory cells, including memory cell 222, in an inner row. Each memory cell may include cross-coupled inverters and additional transistors. In one example, each memory cell may be implemented as a six transistor (6T) memory cell. Other number of cells arranged differently may also be used. Moreover, the memory technology is not limited to an SRAM, but may also include other types of memories, including phase-change memories and magnetic random access memories.

With continued reference to FIG. 2, each of the outer bitlines (e.g., outer bitlines 216 and 218) may be implemented as part of an integrated circuit in a manner such that at least a portion of such outer bitlines can either "fly over" or "fly under" the corresponding inner bitline (e.g., inner bitlines 212 and 214). In this way, each of inner bitlines 212 and 214 and outer bitlines 216 and 218 may be coupled to a shared column multiplexer (mux) 270, or another shared column circuitry. As shown in FIG. 2, each outer bit line (including both BL and BLB bitlines) may include two portions: a first portion (e.g., each of portions 252 and 262) that is accessed when the outer wordline (e.g., WL1 242) is fired and a second portion (e.g., each of portions 256 and 266) that is accessed when the inner wordline (e.g., WL2 244) is fired. The respective portions of the outer bitlines may be coupled via an interconnect. As an example, portion 252 of the outer bitline (BL) is coupled via interconnect 254 to portion 256 of the outer bitline (BL). Similarly, as an example, portion 262 of the outer bitline (BLB) is coupled via interconnect 264 to portion 266 of the outer bitline (BLB). Interconnects 254 and 264 may be implemented as a jumper or another structure that can electrically connect the two portions of the outer bitlines. Moreover, as shown in FIG. 2, in this example portions 256 and 266 of the outer bitlines are the portions that "fly over" or "fly under" a corresponding inner bitline.

Still referring to FIG. 2, in this example, read column select signals (labeled as RDYSEL_B) may be used to select the appropriate columns associated with the memory for outputting data stored in memory cells. In this example, the read column select signal (RDYSEL_B signal) is shown as asserted when it is logic low as opposed to logic high. Sense amplifier 280 may sense the voltage difference between the positive bitline (BL) and the negative bitline (BLB) by amplifying the voltage difference, and then may determine based on the voltage difference whether the stored bit is a logic 1 bit or a logic 0 bit. The output bit may be stored in output data latch 290. Once the read column select signals (RDYSEL_B signals) are used to select the columns for reading the data words out, the sense amplifier(s) associated with the selected bitlines may be enabled via the signal labeled SAEN in FIG. 2. In one example, as described later with respect to FIG. 4, control unit 430 of FIG. 4 may assert the sense enable (SAEN) signal in response to a de-assertion of the corresponding read column select signal (RDYSEL_B signals). As shown in FIG. 2, prior to enabling sense amplifier 280 (e.g., by asserting the signal labeled SAEN), sense amplifier 280 may be pre-charged in response to the assertion of the signal labeled as SAPCHG_B, which is shown asserted as a logic low signal as opposed to a logic high signal. Additional details of these signals and their relationship to each other are further provided with respect to FIGS. 4 and 5.

Figure 3:
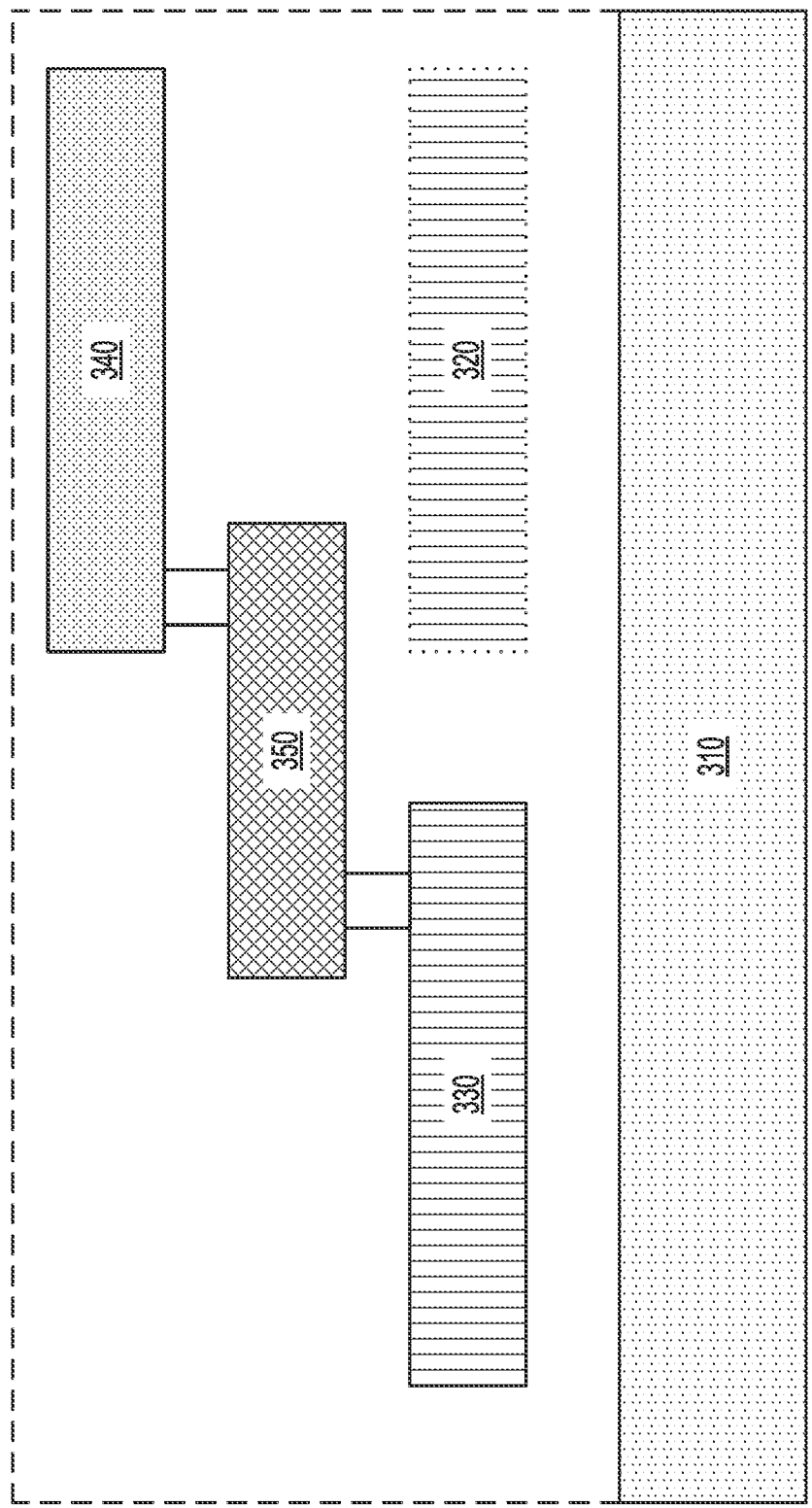
FIG. 3 shows a cross-section view of an implementation of a flying bitline for use in the memory of FIG. 1 in accordance with one example.

FIG. 3 shows a cross-section view 300 of an implementation of a flying bitline for use in memory 100 of FIG. 1 in accordance with one example. Cross-section view 300 shows only a portion of an integrated circuit that may include memory 100. In addition, cross-section view 300 shows only those details that are relevant to the implementation of the flying bitlines for use in memory 100 of FIG. 1. An integrated circuit having memory 100 may include a substrate 310. Substrate 310 may correspond to a die associated with the integrated circuit. Using semiconductor processing techniques various layers, including metal layers, dielectric layers, and other layers, may be formed. In this example, a cross-section view 320 of one of the inner bitlines (e.g., bitline 212 of FIG. 2), which may be formed in metal layer M0, is shown. Cross-section view 320 is shown as dotted because the inner bitline may not be visible in the same plane as a cross-section of the outer bitline. In addition, a cross-section view 330 of a portion of one of the outer bitlines (e.g., portion 252 of an outer bitline similar to outer bitline 216 of FIG. 2), which may also be formed in metal layer M0 at least partially, is shown. A cross-section view 340 of a portion of the outer bitline is shown as flying over the cross-section view 320 of the inner bitline. In this example, the flying portion of outer bitline may be formed in a metal layer M2. In addition, cross-section view 350 shows part of an interconnecting structure (e.g., a jumper) to connect the two portions of the outer bitline. Vias or other mechanisms may be used to connect the portion of outer bitline formed in metal layer M0 with the portion of the outer bitline formed in metal layer M2. Although FIG. 3 shows a certain arrangement of layers and interconnections among them, flying bitlines may be formed using a different arrangement of layers having different interconnections. As an example, although FIG. 3 shows an outer bitline that is "flying over" the inner bitline, the outer bitline may also be formed to "fly under" the inner bitline. In addition, the bitlines need not be directly under or over each other, and they may be offset from each other.

Figure 4:
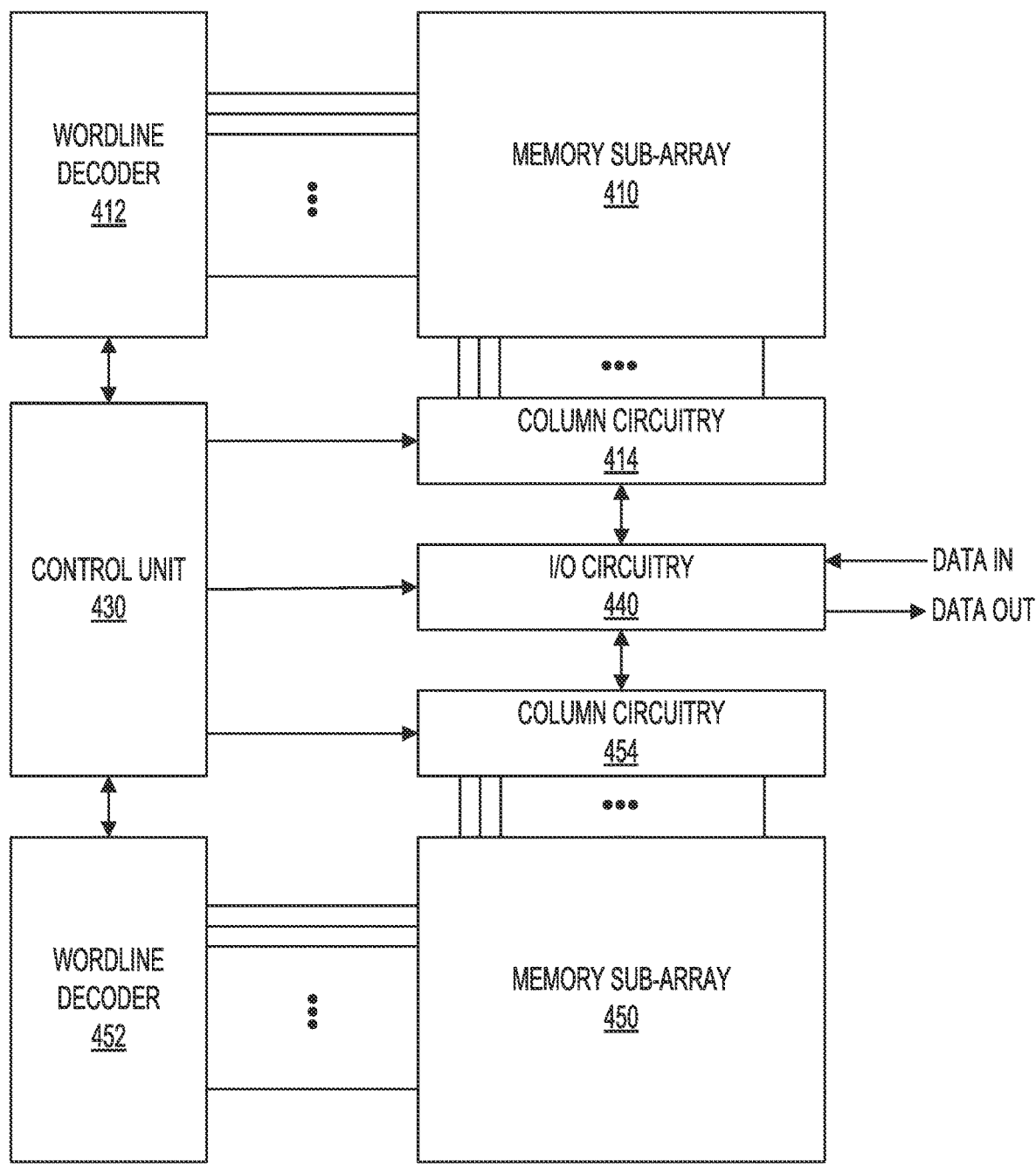
FIG. 4 shows a diagram of a memory system including the memory of FIG. 1.

FIG. 4 shows a diagram of a memory system 400 including memory 100 of FIG. 1. Memory system 400 may be included as an SRAM in an integrated circuit having one or more processing cores. Such an integrated circuit may be implemented as a central processing unit (CPU) (single or multi-core), a graphics processing unit (GPU), or a field programmable gate array (FPGA). Memory system 400 may be implemented as a block RAM (BRAM) as part of an FPGA. Memory system 400 may also be implemented as a standalone memory system. Alternatively, memory system 400 may be integrated with logic as part of a 3D-stacked system (e.g., a high bandwidth memory (HBM) system). Memory system 400 may include two memory sub-arrays: memory sub-array 410 and memory sub-array 450 arranged in the manner shown in FIG. 4. Memory system 400 may further include a wordline decoder 412 coupled to memory sub-array 410 and another wordline decoder 452 coupled to memory sub-array 450. Column circuitry 414 may be coupled to memory sub-array 410 to interface with the bitlines (both inner and outer bitlines) included in memory sub-array 410. Similarly, column circuitry 454 may be coupled to memory sub-array 450 to interface with the bitlines (both inner and outer bitlines) included in memory sub-array 450. I/O circuitry 440 may be coupled to both column circuitry 414 and column circuitry 454. Memory system 400 may further include a control unit 430, which may be coupled to at least wordline decoder 412, wordline decoder 452, column circuitry 414, column circuitry 454, and I/O circuitry 440.

With continued reference to FIG. 4, control unit 430 may generate control signals for controlling the operation of various components of memory system 400. As an example, control unit 430 may process any read/write signals, burst mode signals, and addresses. In one example, control unit 430 may include timing circuitry, finite state machines, and other logic to allow for the generation of appropriate control signals. As an example, control unit 430 may generate control signals, which (directly or indirectly) may generate other signals resulting in the burst mode operation described further with respect to FIG. 5. Although FIG. 4 shows memory system 400 as including a certain number of components arranged in a certain manner, memory system 400 may include additional or fewer components, arranged differently. As an example, control unit 430 may be configured to allow memory system 400 to operate in multiple different burst modes. In one burst mode, two wordlines per memory sub-array (e.g., memory sub-arrays 410 and 450) may be simultaneously asserted to output data from the memory cells. Alternatively, in a second burst mode, only two wordlines for one of the memory sub-arrays (e.g., one of memory sub-arrays 410 and 450) may be activated at a time. The other two wordlines for the other memory sub-array (e.g., another one of memory sub-arrays 410 and 450) may be activated immediately after outputting the data from the first memory sub-array. As part of a third burst mode, one wordline per memory sub-array (e.g., memory sub-array 410 or 450) may be asserted at a time until all four wordlines corresponding to the two memory sub-arrays have been asserted sequentially. The data words may still be output as part of a single burst. In addition, although FIG. 4 shows two memory sub-arrays (e.g., memory sub-array 410 and 450), memory system 400 may include only one sub-array.

Figure 5:
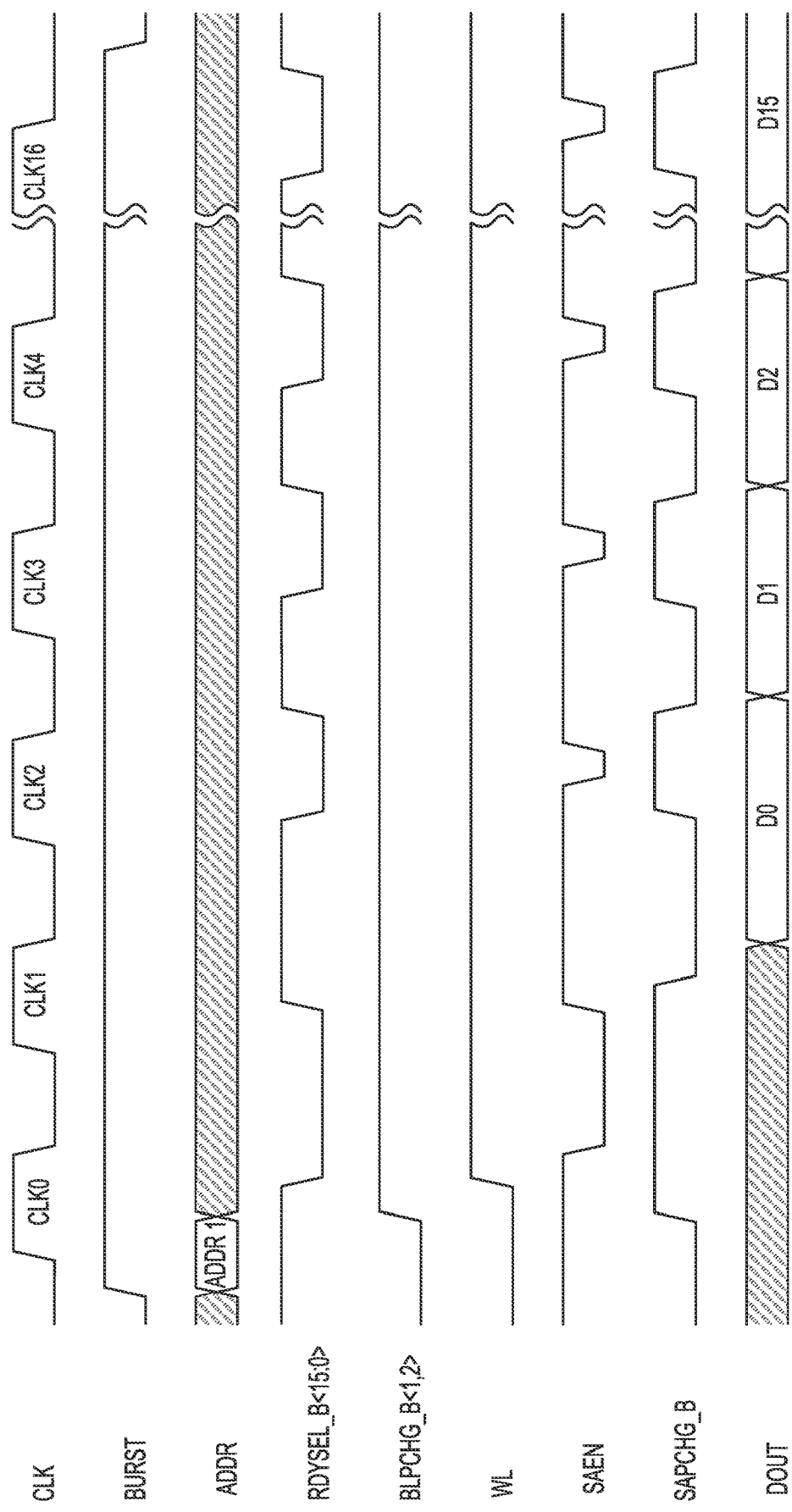
FIG. 5 shows waveforms associated with the burst mode read performed using the memory system of FIG. 4 in accordance with one example.

FIG. 5 shows waveforms 500 associated with the burst mode read performed using memory system 400 of FIG. 4 in accordance with one example. As explained earlier memory system 400 may include memory sub-arrays with both inner and outer bitlines that are configured to output bits in response to the simultaneous assertion of two wordlines per memory sub-array. Memory system 400 may be configured to output a certain number of data words per burst mode cycle. The operation of memory system 400 explained with respect to FIG. 5 assumes that memory system 400 is configured to output 16 data words in response to a burst mode read operation request. The number of data words that are output may depend on the number of columns per memory sub-array. Waveforms 500 show internal waveforms corresponding to the operation of memory system 400, including memory 100 of FIG. 1. Waveforms 500 show an internal clock signal (CLK) associated with memory system 400. This clock signal may be used to coordinate the timing of the assertion and de-assertion of the various signals associated with memory system 400. Waveforms 500 further show a burst mode signal (BURST), which may be processed by control unit 430 associated with memory system 400. In addition, waveforms 500 show the providing of an address (ADDR) for the data (e.g., ADDR1) to be read in the burst mode. In this example, the assertion of the BURST signal indicates to control unit 430 that the read operation is a burst mode read operation as opposed to a non-burst mode operation. In response, control unit 430 may activate logic, including finite state machine(s) and timers, to control the internal timing of the other signals associated with memory system 400.

With continued reference to FIG. 5, in response to the burst mode signal (BURST) and the address (ADDR1), control unit 430 may determine which of the two wordlines need to be fired for each of the memory sub-arrays (e.g., two wordlines for memory sub-array 410 and two wordlines for memory sub-array 450). Prior to firing the wordlines, control unit 430 may precharge both the inner bitlines and the outer bitlines by asserting bit line precharge signals (the waveform labeled as BLPCHG_B<1,2> in FIG. 5) for both memory sub-array 410 and memory sub-array 450. In this example the bitline precharge signals are shown as asserted when the signals are logic low as opposed to logic high. Once precharged, the bitline precharge signals for the two sub-arrays are de-asserted as shown in FIG. 5 and the appropriate wordline signals are simultaneously asserted. In one example, the address (ADDR1) may include at least two address bits for the selection of the appropriate wordlines. The wordline decoders (e.g., wordline decoder 412 and wordline decoder 452) may fire the appropriate wordlines. In this example, control unit 430 may provide control signals to the wordline decoders to control the timing of the assertion of the wordline signals. As an example, control unit 430 may assert control signals that may fire the wordlines after a certain time has elapsed since the de-assertion of the bitline precharge signals (BLPCHG_B<1,2>). For ease of depiction, although waveforms 500 show the firing of a single wordline (WL), in this example, four wordlines are fired simultaneously-two wordlines corresponding to memory sub-array 410 and two wordlines corresponding to memory sub-array 450. Advantageously, in the burst mode read operation multiple words can be output without having to re-fire the wordlines. This is because the wordline signals are kept asserted for the duration of the burst to ensure that both the inner bitlines and the outer bitlines that are being accessed are actively held during the burst read operation.

Still referring to FIG. 5, the column-select signals that allow reading of memory cells coupled to both inner bitlines and outer bitlines corresponding to both memory sub-array 410 and sub-array 450 may be asserted sequentially to read one data word at a time. Read column select signals (labeled as RDYSEL_B<15:0>) show example signals generated by control unit 430 to select the appropriate columns associated with memory system 400 for outputting data stored in memory cells. In this example, unlike the other signals, the read column select signal (RDYSEL_B signal) is shown as asserted when it is logic low as opposed to logic high. Once the read column select signals (RDYSEL_B<15:0> signals) are used to select the columns for reading the data words out, the sense amplifier(s) associated with the selected bitlines may be enabled via the signal labeled SAEN in FIG. 5. In one example, control unit 430 may assert the sense enable (SAEN) signal in response to a de-assertion of the corresponding read column select signal (RDYSEL_B<15:0> signals). As shown in FIG. 5, prior to enabling the sense amplifier, the sense amplifier associated with a selected column for reading may be pre-charged by asserting the signal labeled as SAPCHG_B, which is shown asserted as a logic low signal as opposed to a logic high signal. In this example, sense amplifier (e.g., sense amplifier 280 of FIG. 2, which may be included as part of column circuitry 414 and column circuitry 454 of memory system 400 of FIG. 4) may sense the voltage difference between the positive bitline (BL) and the negative bitline (BLB) by amplifying the voltage difference, and then may determine, based on the voltage difference, whether the stored bit is a logic 1 bit or a logic 0 bit.

With continued reference to FIG. 5, after data word D0 is output (shown as being output as part of the waveform labeled as DOUT), every clock cycle (e.g., clock cycle CLK2, CLK3, . . . CLK16), another data word (e.g., data words D1, D2, . . . D15) may be output by memory system 400. Although FIG. 5 shows waveforms corresponding to a memory system in which the first data word is output in a certain time (e.g., two clock cycles) after the receipt of an address associated with a burst mode read operation, alterations to the memory system may result in an increased or a lowered number of clock cycles for the first data word to be output after the receipt of the address. In addition, depending on the size of the memory arrays, additional or fewer data words per burst mode read operation may be output. In addition, memory system 400 may be operated in a normal mode (e.g., when the burst mode signal (BURST) is not asserted by the processing logic issuing the read request) in which only one or two data words are output per read request.

Figure 6:
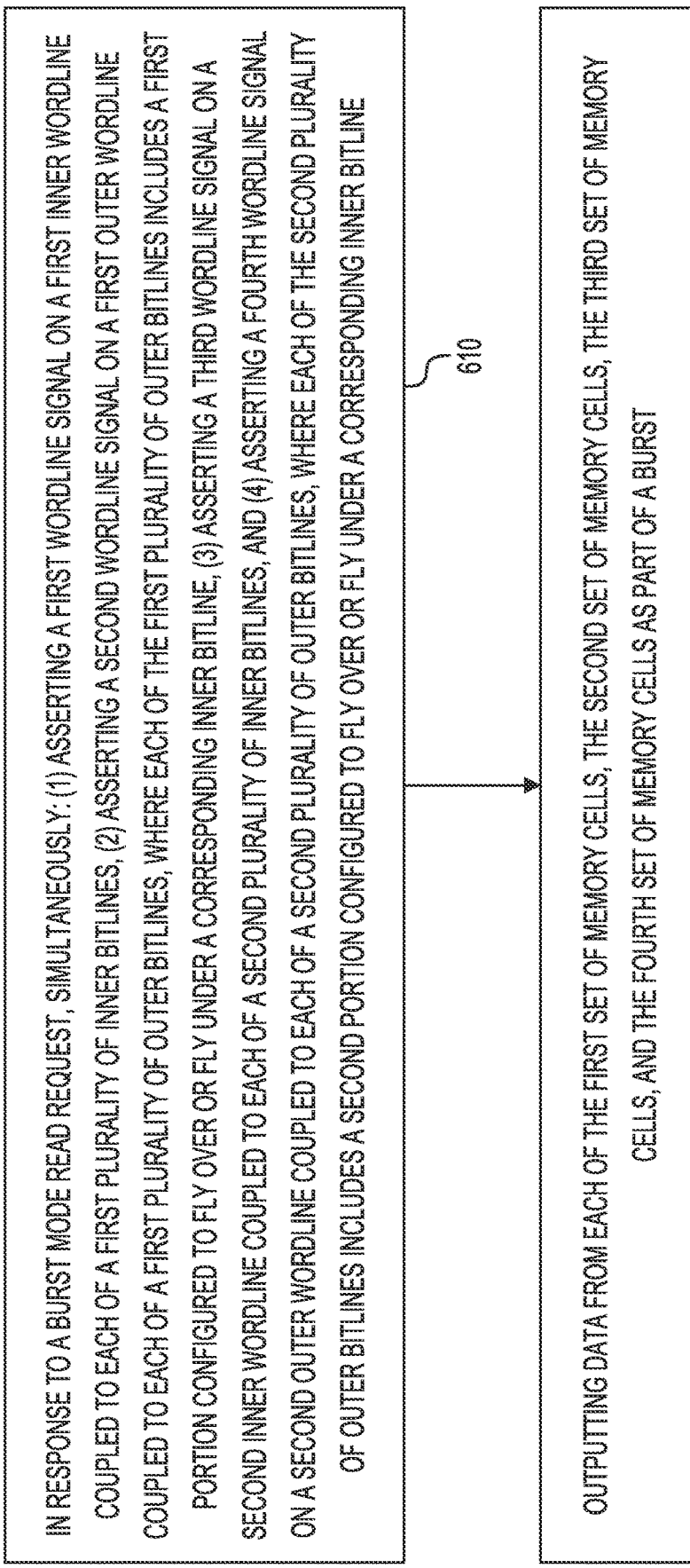
FIG. 6 shows a flowchart of a method for performing a burst mode read using the memory system of FIG. 4 in accordance with an example.

FIG. 6 shows a flow chart 600 of a method for performing a burst mode read using memory system 400 of FIG. 4 in accordance with an example. In one example, the steps described with respect to flow chart 600 may be performed in response (direct or indirect) to the assertion of control signals associated with memory system 400 (e.g., the control signals generated by control unit 430 of FIG. 4). Step 610 may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. As explained earlier, the burst mode request may include asserting the signal labeled BURST in FIG. 5. In response, multiple wordlines (e.g., two wordlines associated with memory sub-array 410 of FIG. 4 and two wordlines associated with memory sub-array 450 of FIG. 4) may be asserted based on control signals from control unit 430.

Step 620 may include outputting data from each of the first set of memory cells, the second set of memory cells, the third set of memory cells, and the fourth set of memory cells as part of a burst. Further details regarding the outputting step are provided with respect to FIGS. 4 and 5. As an example, FIG. 5 shows the DOUT waveform indicating multiple data words being output as part of the burst.

In conclusion, in one example, the present disclosure relates to a method for operating a memory system comprising a first memory sub-array and a second memory sub-array, where the first memory sub-array includes a first set of memory cells coupled to a first inner wordline and a second set of memory cells coupled to a first outer wordline, and where the second memory sub-array includes a third set of memory cells coupled to a second inner wordline and a fourth set of memory cells coupled to a second outer wordline. The method may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. The method may further include outputting data from each of the first set of memory cells, the second set of memory cells, the third set of memory cells, and the fourth set of memory cells as part of a burst.

Each of the first set of memory cells and the second set of memory cells may be organized in a first plurality of columns, and where the method may further comprise selecting one column at a time from among the first plurality of columns in response to an assertion of a read column select signal for outputting the data as part of the burst. Each of the third set of memory cells and the fourth set of memory cells may be organized in a second plurality of columns, and where the method may further comprise selecting one column at a time from among the second plurality of columns in response to an assertion of a read column select signal for outputting the data as part of the burst.

The memory system may be formed as part of an integrated circuit, where each of the first plurality of inner bitlines and the second plurality of inner bitlines may be formed in a first metal layer associated with the integrated circuit, and where each of the first portion configured to fly over or fly under the corresponding inner bitline and the second portion configured to fly over or fly under the corresponding inner bitline may be formed in a second metal layer, different from the first metal layer. Each of the first plurality of outer bitlines may include a second portion formed in the first metal layer, and where the first portion configured to fly over or fly under the corresponding inner bitline may be coupled to the second portion formed in the first metal layer via an interconnect. Each of the second plurality of outer bitlines may include a second portion formed in the first metal layer, and where the second portion configured to fly over or fly under the corresponding inner bitline may be coupled to the second portion formed in the first metal layer via an interconnect.

The memory system may comprise a control unit, and the method may further comprise the control unit generating control signals in response to a receipt of an address associated with the burst mode read request and a burst mode signal. The memory system may further comprise a first wordline decoder associated with the first memory sub-array and a second wordline decoder associated with the second memory sub-array. The method may further comprise the control unit controlling a timing of an assertion of wordline signals by both the first wordline decoder and the second wordline decoder such that each of the first inner wordline, the first outer wordline, the second inner wordline, and the second outer wordline is activated during the burst.

In another example, the present disclosure relates to a memory system comprising a memory array including a first set of memory cells coupled to a first inner wordline and a second set of memory cells coupled to a first outer wordline. The memory system may further include a control unit configured to generate control signals for: in response to a burst mode read request, simultaneously: in response to a burst mode read request, simultaneously: (1) asserting a first wordline signal on the first inner wordline coupled to each of a plurality of inner bitlines, and (2) asserting a second wordline signal on the first outer wordline coupled to each of a plurality of outer bitlines, where each of the plurality of outer bitlines includes a first portion configured to fly over or fly under a corresponding inner bitline, and outputting data from each of the first set of memory cells and the second set of memory cells as part of a burst.

Each of the first set of memory cells and the second set of memory cells may be organized in a plurality of columns, and where the control unit may further be configured to generate control signals for selecting one column at a time from among the plurality of columns in response to an assertion of a read column select signal for outputting the data as part of the burst. The memory system may further include a plurality of sense amplifiers coupled to the plurality of columns such that each of the plurality of columns has a corresponding sense amplifier.

The memory system may be formed as part of an integrated circuit, where each of the plurality of inner bitlines may be formed in a first metal layer associated with the integrated circuit, and where the first portion configured to fly over or fly under the corresponding inner bitline may be formed in a second metal layer, different from the first metal layer. Each of the plurality of outer bitlines may include a second portion formed in the first metal layer, and where the first portion configured to fly over or fly under the corresponding inner bitline may be coupled to the second portion formed in the first metal layer via an interconnect In yet another example, the present disclosure relates to a memory system comprising a first memory sub-array and a second memory sub-array, where the first memory sub-array includes a first set of memory cells coupled to a first inner wordline and a second set of memory cells coupled to a first outer wordline, where the second memory sub-array includes a third set of memory cells coupled to a second inner wordline and a fourth set of memory cells coupled to a second outer wordline, where each of the first set of memory cells and the second set of memory cells is organized in a first plurality of columns, and where each of the third set of memory cells and the fourth set of memory cells is organized in a second plurality of columns. The memory system may further include a control unit configured to generate control signals for: in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, where each of the second plurality of outer bitlines includes a second portion configured to fly over or fly under a corresponding inner bitline, and using the shared column circuitry, and outputting data from each of the first set of memory cells, the second set of memory cells, the third set of memory cells, and the fourth set of memory cells as part of a burst. Alternatively, in a second burst mode, the control unit may be configured to generate control signals for: in response to a second mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, where each of the first plurality of outer bitlines includes a first portion configured to fly over or fly under a corresponding inner bitline, and outputting data from each of the first set of memory cells and the second set of memory cells.

The control unit may further be configured to generate control signals for selecting one column at a time from among the first plurality of columns in response to an assertion of a read column select signal for outputting the data as part of the burst. The control unit may further be configured to generate control signals for selecting one column at a time from among the second plurality of columns in response to an assertion of a read column select signal for outputting the data as part of the burst. The memory system may include a plurality of sense amplifiers coupled to the first plurality of columns and the second plurality of columns such that each of the first plurality of columns and the second plurality of columns may have a corresponding shared sense amplifier from among the plurality of sense amplifiers.

The memory system may be formed as part of an integrated circuit, where each of the first plurality of inner bitlines and the second plurality of inner bitlines may be formed in a first metal layer associated with the integrated circuit, and where each of the first portion configured to fly over or fly under the corresponding inner bitline and the second portion configured to fly over or fly under the corresponding inner bitline may be formed in a second metal layer, different from the first metal layer. Each of the first plurality of outer bitlines may include a second portion formed in the first metal layer, and where the first portion configured to fly over or fly under the corresponding inner bitline may be coupled to the second portion formed in the first metal layer via an interconnect. Each of the second plurality of outer bitlines may include a second portion formed in the first metal layer, and where the second portion configured to fly over or fly under the corresponding inner bitline may be coupled to the second portion formed in the first metal layer via an interconnect It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method for operating a memory system comprising a first memory sub-array and a second memory sub-array, wherein the first memory sub-array includes a first set of memory cells coupled to a first inner wordline and a second set of memory cells coupled to a first outer wordline, wherein each of the first set of memory cells and the second set of memory cells is organized in a first plurality of columns, wherein the second memory sub-array includes a third set of memory cells coupled to a second inner wordline and a fourth set of memory cells coupled to a second outer wordline, and wherein each of the third set of memory cells and the fourth set of memory cells is organized in a second plurality of columns, the method comprising:
in response to a burst mode read request, simultaneously:
(1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, wherein each of the second plurality of outer bitlines includes a second portion configured to fly over or fly under a corresponding inner bitline; and
outputting data from each of the first set of memory cells, the second set of memory cells, the third set of memory cells, and the fourth set of memory cells as part of a burst, wherein the method further comprises: (1) selecting one column at a time from among the first plurality of columns in response to an assertion of a read column select signal for outputting the data as part of the burst and (2) selecting one column at a time from among the second plurality of columns in response to an assertion of a read column select signal for outputting the data as part of the burst.

2. The method of claim 1, wherein the memory system is formed as part of an integrated circuit, wherein each of the first plurality of inner bitlines and the second plurality of inner bitlines is formed in a first metal layer associated with the integrated circuit, and wherein each of the first portion configured to fly over or fly under a corresponding inner bitline and the second portion configured to fly over or fly under a corresponding inner bitline is formed in a second metal layer, different from the first metal layer.

3. The method of claim 2, wherein each of the first plurality of outer bitlines includes a second portion formed in the first metal layer, and wherein the first portion configured to fly over or fly under the corresponding inner bitline is coupled to the second portion formed in the first metal layer via an interconnect.

4. The method of claim 3, wherein each of the second plurality of outer bitlines includes a second portion formed in the first metal layer, and wherein the second portion configured to fly over or fly under the corresponding inner bitline is coupled to the second portion formed in the first metal layer via an interconnect.

5. The method of claim 4, wherein the memory system comprises a control unit, further comprising the control unit generating control signals in response to a receipt of an address associated with the burst mode read request and a burst mode signal.

6. The method of claim 5, wherein the memory system comprises a first wordline decoder associated with the first memory sub-array and a second wordline decoder associated with the second memory sub-array, further comprising the control unit controlling a timing of an assertion of wordline signals by both the first wordline decoder and the second wordline decoder such that each of the first inner wordline, the first outer wordline, the second inner wordline, and the second outer wordline is activated during the burst.

7. The method of claim 1, wherein the memory system further comprises a plurality of sense amplifiers coupled to the first plurality of columns and the second plurality of columns such that each of the first plurality of columns and the second plurality of columns has a corresponding shared sense amplifier from among the plurality of sense amplifiers.

8. The method of claim 1, further comprising, prior to asserting the first wordline signal, the second wordline signal, the third wordline signal, and the fourth wordline signal, asserting bitline precharge signals for bitlines in both the first memory sub-array and the second memory sub-array.

9. A memory system comprising:
a first memory array including a first set of memory cells coupled to a first inner wordline and a second set of memory cells coupled to a first outer wordline;
a second memory array including a third set of memory cells coupled to a second inner wordline and a fourth set of memory cells coupled to a second outer wordline; and
a control unit configured to generate control signals for:
in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, wherein each of the second plurality of outer bitlines includes a second portion configured to fly over or fly under a corresponding inner bitline, and
outputting data from each of the first set of memory cells, the second set of memory cells as part of a burst, the third set of memory cells, and the fourth set of memory cells, wherein the memory system is formed as part of an integrated circuit, wherein each of the first plurality of inner bitlines and the second plurality of inner bitlines is formed in a first metal layer associated with the integrated circuit, and wherein each of the first portion configured to fly over or fly under a corresponding inner bitline and the second portion configured to fly over or fly under a corresponding inner bitline is formed in a second metal layer, different from the first metal layer, wherein each of the first plurality of outer bitlines includes a second portion formed in the first metal layer, and wherein the first portion configured to fly over or fly under the corresponding inner bitline is coupled to the second portion formed in the first metal layer via an interconnect, and wherein each of the second plurality of outer bitlines includes a second portion formed in the first metal layer, and wherein the second portion configured to fly over or fly under the corresponding inner bitline is coupled to the second portion formed in the first metal layer via an interconnect.

10. The memory system of claim 9, wherein each of the first set of memory cells, the second set of memory cells, the third set of memory cells, and the fourth memory cells is organized in a plurality of columns, and wherein the control unit is further configured to generate control signals for selecting one column at a time from among the plurality of columns in response to an assertion of a read column select signal for outputting the data as part of the burst.

11. The memory system of claim 10, further comprising a plurality of sense amplifiers coupled to the plurality of columns such that each of the plurality of columns has a corresponding sense amplifier.

12. The memory system of claim 9, wherein the control unit is further configured to generate signals for, prior to asserting the first wordline signal, the second wordline signal, the third wordline signal, and the fourth wordline signal, asserting bitline precharge signals for bitlines in both the first memory sub-array and the second memory sub-array.

13. A memory system comprising:
a first memory sub-array and a second memory sub-array, wherein the first memory sub-array includes a first set of memory cells coupled to a first inner wordline and a second set of memory cells coupled to a first outer wordline, wherein the second memory sub-array includes a third set of memory cells coupled to a second inner wordline and a fourth set of memory cells coupled to a second outer wordline, wherein each of the first set of memory cells and the second set of memory cells is organized in a first plurality of columns, and wherein each of the third set of memory cells and the fourth set of memory cells is organized in a second plurality of columns; and
a control unit configured to generate control signals both for:
in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, wherein each of the second plurality of outer bitlines includes a second portion configured to fly over or fly under a corresponding inner bitline, and using the shared column circuitry, and outputting data from each of the first set of memory cells, the second set of memory cells, the third set of memory cells, and the fourth set of memory cells as part of a burst, or
in a second burst mode, in response to a second mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, wherein each of the first plurality of outer bitlines includes a first portion configured to fly over or fly under a corresponding inner bitline, and outputting data from each of the first set of memory cells and the second set of memory cells.

14. The memory system of claim 13, wherein the control unit is further configured to generate control signals for selecting one column at a time from among the first plurality of columns in response to an assertion of a read column select signal for outputting the data as part of the burst.

15. The memory system of claim 14, wherein the control unit is further configured to generate control signals for selecting one column at a time from among the second plurality of columns in response to an assertion of a read column select signal for outputting the data as part of the burst.

16. The memory system of claim 15, further comprising a plurality of sense amplifiers coupled to the first plurality of columns and the second plurality of columns such that each of the first plurality of columns and the second plurality of columns has a corresponding shared sense amplifier from among the plurality of sense amplifiers.

17. The memory system of claim 13, wherein the memory system is formed as part of an integrated circuit, wherein each of the first plurality of inner bitlines and the second plurality of inner bitlines is formed in a first metal layer associated with the integrated circuit, and wherein each of the first portion configured to fly over or fly under a corresponding inner bitline and the second portion configured to fly over or fly under a corresponding inner bitline is formed in a second metal layer, different from the first metal layer.

18. The memory system of claim 17, wherein each of the first plurality of outer bitlines includes a second portion formed in the first metal layer, and wherein the first portion configured to fly over or fly under the corresponding inner bitline is coupled to the second portion formed in the first metal layer via an interconnect.

19. The memory system of claim 18, wherein each of the second plurality of outer bitlines includes a second portion formed in the first metal layer, and wherein the second portion configured to fly over or fly under the corresponding inner bitline is coupled to the second portion formed in the first metal layer via an interconnect.

20. The memory system of claim 13, wherein the control unit is further configured to: (1) in the first burst mode generate signals for, prior to asserting the first wordline signal, the second wordline signal, the third wordline signal, and the fourth wordline signal, asserting bitline precharge signals for bitlines in both the first memory sub-array and the second memory sub-array, and (2) in the second burst mode generate signals for, prior to asserting the first wordline signal and the second wordline signal, asserting bitline precharge signals for bitlines in the first memory sub-array.

\* \* \* \* \*